United States Patent [19]

Connell et al.

[11] Patent Number: 4,710,724

[45] Date of Patent: Dec. 1, 1987

[54] DIFFERENTIAL CMOS COMPARATOR FOR SWITCHED CAPACITOR APPLICATIONS

[75] Inventors: Lawrence E. Connell, Darien; Ronald J. Webb, Elgin, both of Ill.

[73] Assignee: Motorola, Inc., Schaumburg, Ill.

[21] Appl. No.: 847,361

[22] Filed: Apr. 2, 1986

[51] Int. Cl.[4] .......................... H03F 1/26; H03F 3/45
[52] U.S. Cl. ..................................... 330/9; 330/253; 330/261; 307/362
[58] Field of Search .................. 330/9, 253, 257, 261; 307/350, 362, 363

[56] References Cited

U.S. PATENT DOCUMENTS

| | | | |
|---|---|---|---|
| 4,255,715 | 3/1981 | Cooperman | 330/9 |
| 4,262,221 | 4/1981 | Dingwall | 307/362 X |
| 4,320,347 | 3/1982 | Haque | 330/9 |
| 4,375,625 | 3/1983 | Lee | 333/213 |
| 4,423,385 | 12/1983 | Evans | 330/9 |
| 4,431,971 | 2/1984 | Haque | 330/253 |
| 4,442,529 | 4/1984 | Ahuja et al. | 375/34 |
| 4,518,869 | 5/1985 | Herold | 307/350 |
| 4,529,965 | 7/1985 | Lee | 340/347 AD |
| 4,539,495 | 9/1985 | Demler | 307/530 |
| 4,543,534 | 9/1985 | Temes et al. | 330/9 |
| 4,543,546 | 9/1985 | Hariharan | 333/173 |

OTHER PUBLICATIONS

McCreary, J. L., "An NMOS Comparator for a Bubble Memory", *IEEE Journal of Solid-State Circuits*, vol. SC-16, No. 6, Dec. 1981.

Senderowicz, D., et al., "High-Performance NMOS Operational Amplifier", *IEEE Journal of Solid-State Circuits*, vol. SC-13, No. 6, Dec. 1978.

Motorola MC68HC11A8, Technical Summary Publication-printed Mar. 1985.

Motorola MC68HC11A8, Advance Information Publication-printed Apr. 1985.

*Primary Examiner*—James B. Mullins
*Attorney, Agent, or Firm*—Douglas A. Boehm; Donald B. Southard; Charles L. Warren

[57] ABSTRACT

A differential input circuit for a switched capacitor CMOS voltage comparator is provided which minimizes offset voltages by configuring the load devices to utilize a single switched capacitor biasing network initialized from internally-generated bias voltages, while configuring the initialization switches for the differential input devices to also utilize internally-generated bias voltages such that the offset voltages are stored on the input capacitors. The power supply rejection performance of the voltage comparator is also optimized by connecting parallel load devices of opposite switching topology such that the same input impedance is seen at both load terminals.

29 Claims, 3 Drawing Figures

DIFFERENTIAL CMOS COMPARATOR FOR SWITCHED CAPACITOR APPLICATIONS

BACKGROUND OF THE INVENTION

The present invention is generally related to complementary-metal-oxide-semiconductor (CMOS) integrated circuits for voltage comparator applications. More particularly, the present invention is directed to the reduction of input voltage offsets in a switched capacitor differential input stage, thereby providing a voltage comparator circuit specifically adapted for use in precision analog-to-digital (A/D) conversion and zero-crossing detection applications.

An input voltage offset in a differential amplifier refers to the amount of input voltage that must be applied to one input terminal in order to produce a zero output voltage. Offsets can be attributed to geometry variations, mobility mismatches, impurity concentration variations, and mismatches in device thresholds from transistor-totransistor. The input voltage offset, if multiplied by the gain of the differential amplifier stage, would be a measure of the output voltage offset. For example, a 5 millivolt input voltage offset in an amplifier with an open loop gain of 1000 causes five volts at the output terminal in the absence of an input signal. Even a relatively small voltage offset, when multiplied by the gain of the differential amplifier stage, could saturate the amplifier stage during operation. Closing the feedback loop reduces the magnitude of the output offset voltage, but signal gain is also reduced.

Various attempts have been made in the prior art to eliminate these offset errors in MOS integrated circuits. Cooperman, in U.S. Pat. No. 4,255,715, requires numerous correction cycles to couple the output voltage offset to a storage capacitor via an external offset correction circuit. Many applications preclude the use of this technique due to the significant initialization time delays necessary on power-up.

A variation on the switched capacitor type of offse correction circuit is presented in the article entitled, "An NMOS Comparator for a Bubble Memory", *IEEE Journal of SolidState Circuits*, Vol. SC-16, No. 6, December 1981, by J.L. McCreary and J.B. Hunt. In this approach, the input capacitors are initialized to bias the differential input stage to the proper operating point. This is accomplished through the use of clamp or bias switches connected to an external DC bias voltage source. However, to reduce the input transistor offsets, the prior art relies upon staggered clock techniques and multiple gain stages.

Hence, these prior art techniques fail to effectively solve the offset voltage problem inherent in CMOS integrated circuit differential comparators. An effective solution must also consider fabrication cost limitations and integrated circuit area requirements. A need, therefore, exists for an improved voltage comparator which addresses these issues.

SUMMARY OF THE INVENTION

It is primary object of the present invention to provide a differential input circuit configuration for a voltage comparator which exhibits low offset voltage.

Another object of the present invention is to optimize the voltage gain of a single-stage differential comparator.

A further object of the present invention is to provide a differential comparator stage having improved power supply rejection performance.

Still another object of the present invention is to provide a switched capacitor CMOS voltage comparator circuit having a minimal number of devices so as to minimize fabrication cost and required integration area.

In accordance with the present invention, a differential input circuit for a switched capacitor CMOS voltage comparator is provided which minimizes offset voltages by configuring the load devices to utilize a single switched capacitor biasing network initialized from internally-generated bias voltages, while configuring the initialization switches for the differential input devices to also utilize internally-generated bias voltages such that the offset voltages are stored on the input capacitors. The power supply rejection performance of the voltage comparator is also optimized by connecting parallel load devices of opposite switching topology such that the same input impedance is seen at both load terminals.

In the preferred embodiment, a switched capacitor voltage comparator is provided which comprises: a differential input stage including a pair of input devices connected in a differential amplifier configuration, the input stage having corresponding pairs of input terminals and output terminals; a load stage including a first pair of load devices connected to the pair of output terminals, each load device having a control terminal therof connected to a first common bias node; and a first biasing network, including a switched capacitor circuit coupled to the first common bias node, for biasing the first pair of load devices. Furthermore, the load stage may also include: a second pair of load devices connected to the pair of outpu terminals, each load device having a control terminal thereof connected to a second common bias node; and a second biasing network, including another switched capacitor circuit coupled to the second common bias node, for biasing the second pair of load devices.

The present invention provides numerous advantages over the prior art. The specific details of these points will be more fully understood by reference to the detailed description section. However, these advantages are listed below as an overview.

(a) The initialization switches for the differential input devices are configured such that the offset voltages are reflected onto the input capacitors by utilizing internally-developed bias voltages. When the offset is stored at the input of the differential stage in this way, a high gain can be achieved without incurring saturation due to input stage offsets.

(b) A large voltage gain is accomplished in a single stage by using internal bias points instead of externally generated bias voltages for the load devices. In this manner, no loss of gain is experienced due to mismatch between the load devices and the devices used to develop th bias voltage source.

(c) During initialization, the switches are closed to bias both load devices to a common operating point. After initialization, the load devices must then maintain the identical bias point. In this way, the full differential gain is apparent at the output.

(d) By optimizing the gain of a single stage, the need for multiple gain stages with various staggered clock waveforms and strict timing requirements is eliminated.

(e) With the present circuit configuration, the resultant offset voltage is a function of the matching between only two switches and two capacitors. To achieve comparable results, the prior art relies on the matching between seven or more pairs of devices.

(f) The effect of power supply noise on the load devices is reduced by the use of a capacitor a the load biasing means. Any noise on the negative supply voltage will then be coupled through to the load bias node to maintain a relatively constant bias voltage.

(g) The power supply rejection performance is further improved by connecting parallel load devices of opposite switching topology such that the sam input impedance is seen at both load terminals. This may be accomplished in the same integration area, since the device geometry is reduced in half.

(h) A fast slew rate is achieved without the need for additional source-follower transistors for initialization, since the present switching configuration creates low impedance drivers from the original input and load devices.

(i) Complex common-mode feedback circuitry is avoided, since this compensation function is accomplished via feedback through the load devices. In the present invention, the common-mode output voltage is sensed through the gate-to-drain capacitance of the load transistors.

Hence, the present invention provides a significantly improved circuit configuration for the differential input stage of a voltage comparator.

BRIEF DESCRIPTION OF THE DRAWINGS

Additional objects, features and advantages in accordance with the present invention will be more clearly understood by way of unrestricted example from the following detailed description, taken together with the accompanying drawings, in the several figures of which like referenced numerals identify like elements and in which.

DETAILED DESCRIPTION OF THE DRAWINGS

Figure 1:
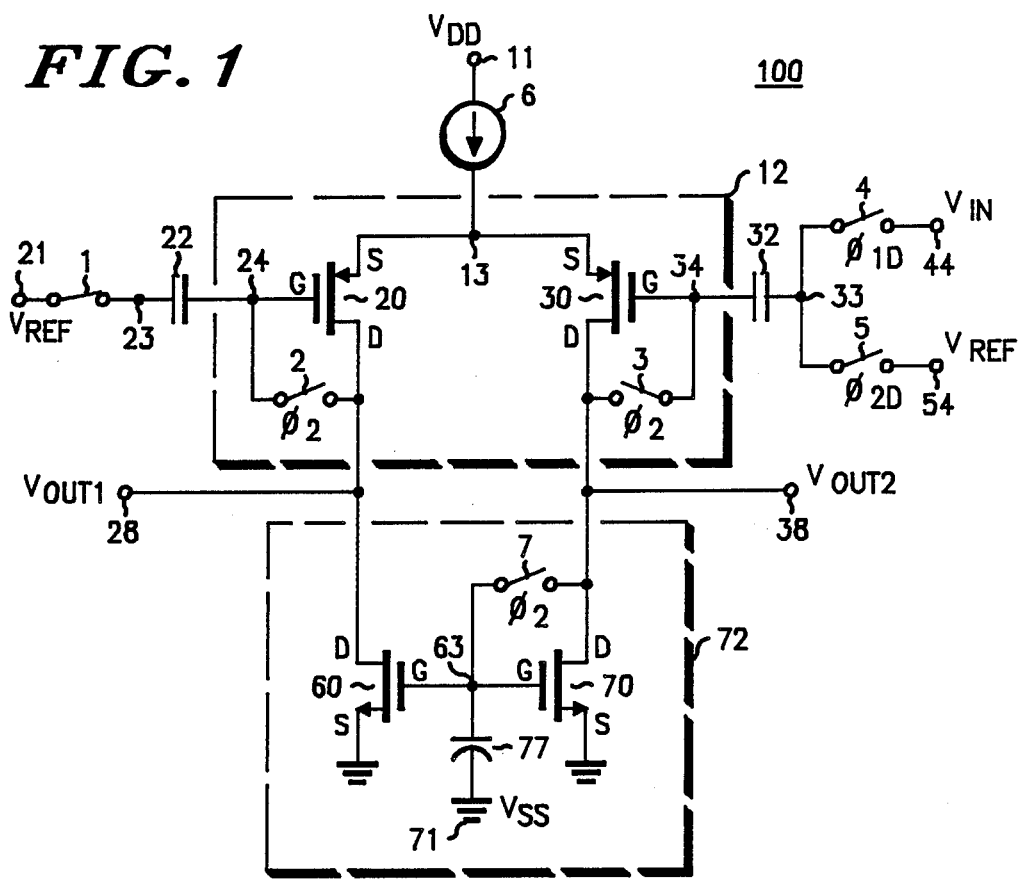
FIG. 1 is a simplified circuit diagram of a voltage comparator differential input stage according to the present invention.

Referring now to FIG. 1, a simplified schematic diagram of differential input circuit 100 is shown configured in accordance with the present invention. Input transistors 20 and 30 are connected in a differential amplifier configuration to form input stage 12. In the preferred embodiment, transistors 20 and 30 are P-channel MOSFET (metal-oxide-semiconductor-field-effect-transistor) devices. However, it should be noted that N-channel devices may also be used in a reversed-topology version of the circuit. Load transistors 60 and 70 form the major part of load stage 72. These N-channel MOSFETs are connected to output terminals 28 and 38, of input stage 12, to provide a differential load pair.

Positive supply voltage VDD is connected to supply terminal 11, while negative supply voltage VSS is connected to ground terminal 71. Constant current source 6 provides the proper bias voltage at supply node 13 such that the input signal cannot modulate the total load current; only the difference between the load currents can vary. The source terminals S of input transistors 20 and 30 are both connected to supply node 13. The drain terminals D of input transistors 20 and 30 are connected to output terminals 28, and 38, respectively. The gate terminals G of the input transistors serve as input nodes 24 and 34 for differential input stage 12. Input capacitor 22 couples the gate terminal of input transistor 20 to input node 23. Similarly, input capacitor 32 couples the gate terminal of input transistor 30 to input node 33. The capacitance values of input capacitors 22 and 32 are substantially equal.

Initialization switches 2 and 3 are connected between the gate and drain terminals of input transistors 20 and 30, respectively. Switches 2 and 3 are closed during an initialization cycle to set up the proper bias voltages for differential input circuit 100. Subsequently, these switches are opened to allow input transistors 20 and 30 to function as a differential input stage during a comparison cycle. Initialization switches 2 and 3 are controlled by clock 2 signal $\phi_2$. This clock signal, and hence the operation of these initialization switches, will be described later. In the preferred embodiment, initialization switches 2 and 3 are N-channel MOSFETs.

Input switches 1, 4, and 5 serve to couple the proper input voltage to the differential input stage during the appropriate timing cycle. More specifically, reference voltage VREF, available at input terminals 21 and 54, is applied to input nodes 23 and 33 via input switches 1 and 5, respectively, during the initialization cycle. Subsequently, input switch 5 is opened and input switch 4 is closed to apply input signal VIN, available at input terminal 44, to input node 33. During the comparison cycle, the input signal $V_{IN}$ is compared to VREF which was stored on capacitor 32 during the initialization cycle. Input switch 4 is controlled by delayed clock 1 signal $\phi_{1D}$, while input switch 5 is controlled by delayed clock 2 signal $\phi_{2D}$. Input switch 1 remains closed during all clock cycles, since it is utilized solely to provide proper input impedance matching for the differential input stage. In short, the differential comparator is initialized with $V_{REF}$ before it compares $V_{IN}$ to $V_{REF}$.

Hence one aspect of the present invention lies in the particular initialization switch configuration fo the differential input devices. The input offset voltage is reflected to and stored on the input capacitors such that the comparator does not amplify the offsets. As a result, large gain devices may be utilized a input transistors 20 and 30. Furthermore, an internally-developed bias voltage is used for the load devices such that no gain loss is introduced through an external bias source. Still further, in the present switch configuration, the resultant offset voltage is a function of the matching between only switch devices, 2 and 3, and the two input capacitors, 22 and 32.

Load stage 72 provides load devices 60 and 70 for input transistors 20 and 30. The drain terminal D of load transistor 60 is connected to the drain terminal of input transistor 20, which is also output terminal 28. Similarly, the drain terminal of load transistor 70 is connected to the drain terminal of input transistor 30, which is output terminal 38. The source terminal S of both load transistors 60 and 70 are grounded. The gate terminals G of load transistors 60 and 70 are connected together at bias node 63. A single bias capacitor 77, connected from bias node 63 to ground 71, is utilized to maintain the identical bias point at the gate terminal of both load transistors. This bias point is fixed during the initialization cycle by shorting bias node 63 to the drain terminal of load transistor 70 through initialization switch 7. (As will be seen later, initialization switch 7 may be connected from bias node 63 to either load device drain terminal.) Initialization switch 7 is controlled by clock 2 signal $\phi_2$. In this configuration, both load transistor gate terminals are biased to the output voltage VOUT2 (or VOUT1 depending on switch 7 connections) during the initialization cycle.

If the gate terminals of the load devices wer not connected together, gate-to-drain capacitances could cause the individual load transistor gate bias to follow the output voltage. This would result in unequal operating points for the load devices, which translates into lower gain for the differential input stage. More importantly, the switches and capacitors used to develop and store the load bias voltage would contribute to the resultant offset voltage.

If, however, the gate terminals of the load devices are connected to a common bias point, any mismatch between the switches used to develop the bias for the load devices cannot result in differing load bias points. Hence, the circuit configuration of FIG. 1 maintains the gate terminals of load transistors 60 and 70 at a common bias point without sacrificing the differential mode operation of the outputs. This common load device bias capacitor configuration represents the second important aspect of the present invention.

Figure 2:
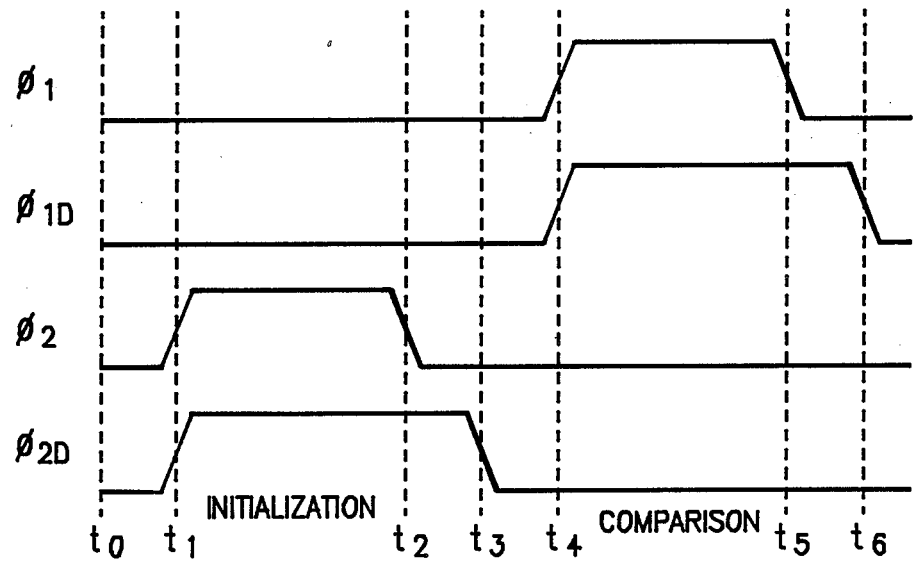
FIG. 2 illustrates the clocking voltages supplied to the various clocking terminals of the differential comparator of FIG. 1.

FIG. 2 illustrates the clock signal waveforms which control the initialization and input switches. Th period of time that clock 1 signal $\phi_1$ is high represents the time in which differential input circuit 100 is performing the comparison function. Clock 1 signal $\phi_1$ is not used in the circuit. Delayed clock 1 signal $\phi_{1D}$ represents a time-extended version of $\phi_1$, which is then used to control input switch 4. A high level of clock 2 signal $\phi_2$ represents the duration of the initialization cycle, which controls initialization switches 2, 3, and 7. Delayed clock 2 signal $\phi_{2D}$, the extended version of $\phi_2$, is used to control input switch 5. As previously mentioned, input switch 1 remains closed during both the initialization and comparison cycles. In the preferred embodiment, the clocking signals are provided by the common clock generator circuitry also used for switched capacitor filters.

A complete operation cycle of the circuit of Figure 1 will now be described in connection with the clock waveform diagrams of FIG. 2.

Time period $t_0$–$t_1$ represents a "guard time" between the comparison and initialization cycles. During this guard time period, all initialization switches and input switches (except input switch 1) remain open. The $t_0$–$t_1$ time period is of a very short duration (i.e., on the order of 100 nanoseconds). The guard time provides a time period wherein both input switches 4 and 5 are open, thus preventing the possibility of a short circuit between $V_{IN}$ and $V_{REF}$.

Time period $t_1$–$t_2$ represents the initialization cycle. During this time period, $\phi_2$ and $\phi_{2D}$ remain high such that initialization switches 2, 3 and 7, and input switch 5, are closed. The initialization cycle permits VREF to be applied through input switches 1 and 5 to both input terminals 23 and 33, such that one side of input capacitors 22 and 32 are biased to the proper DC reference point. At the same time, initialization switches 2, 3 and 7 close to set up the proper operating point bias voltages for input transistors 20, 30, and load transistors 60, 70. These internal operating points are determined by the device characteristics of transistors 20, 30, 60, and 70. In this manner, any offset voltages created by these transistors are reflected to and stored on input capacitors 22 and 32. The duration of initialization cycle $t_1$–$t_2$ in the preferred embodiment is on the order of three microseconds.

Following the initialization cycle, a short delay period $t_2$–$t_3$ (on the order of 100 nanoseconds) is utilized to prevent input switches 4 and 5 from contributing to the final output offset voltage. At $t_2$, clock 2 signal $\phi_2$ goes low to open initialization switches 2, 3, and 7, while delayed clock 2 signal $\phi_{2D}$ remains high to keep input switch 5 closed. During this delay period, VREF is still applied to input node 33 to prevent switch 5 from contributing to any offset voltage at input node 33. (Since VIN at terminal 44 is a low impedance source, it will overdrive any offset voltages introduced upo the opening of switch 5 or the closing of switch 4.)

Another guard time $t_3$–$t_4$ follows next. Again, this short guard (on the order of 100 nanoseconds) provides a period of time between the opening of input switch 5 and the closing of input switch 4, thus preventing a possible short circuit between $V_{IN}$ and $V_{REF}$. During time $t_3$–$t_4$, all input and initialization switches (except input switch 1) are open.

Input signal VIN is compared to reference voltage VREF during the comparison cycle $t_4$–$t_5$. When delayed clock 1 signal $\phi_{1D}$ goes high, input switch 4 closes to apply $V_{IN}$ to input node 33. Input switch 1 remains closed such that $V_{REF}$ is constantly available at input node 23. During this comparison cycle, the voltage difference between $V_{IN}$ and $V_{REF}$ appears at output terminals 28 and 38 as output voltages $V_{OUT1}$ and $V_{OUT2}$, respectively. These output voltages may then be applied to a level shifter stage (not shown) and/or an output driver stage (also not shown) to provide proper final voltage levels for the particular application. In the preferred embodiment, the comparison cycle $t_4$–$t_5$ is approximately 3 microseconds in duration, after which the output voltage differential is stored in a memory device such as D-type flip-flop.

Following the comparison cycle, another delay cycle $t_5$–$t_6$ (again on the order of 100 microseconds in duration) can be implemented to accommodate a second comparator which could then be initialized during the $t_4$–$t_5$ time period.

Figure 3:
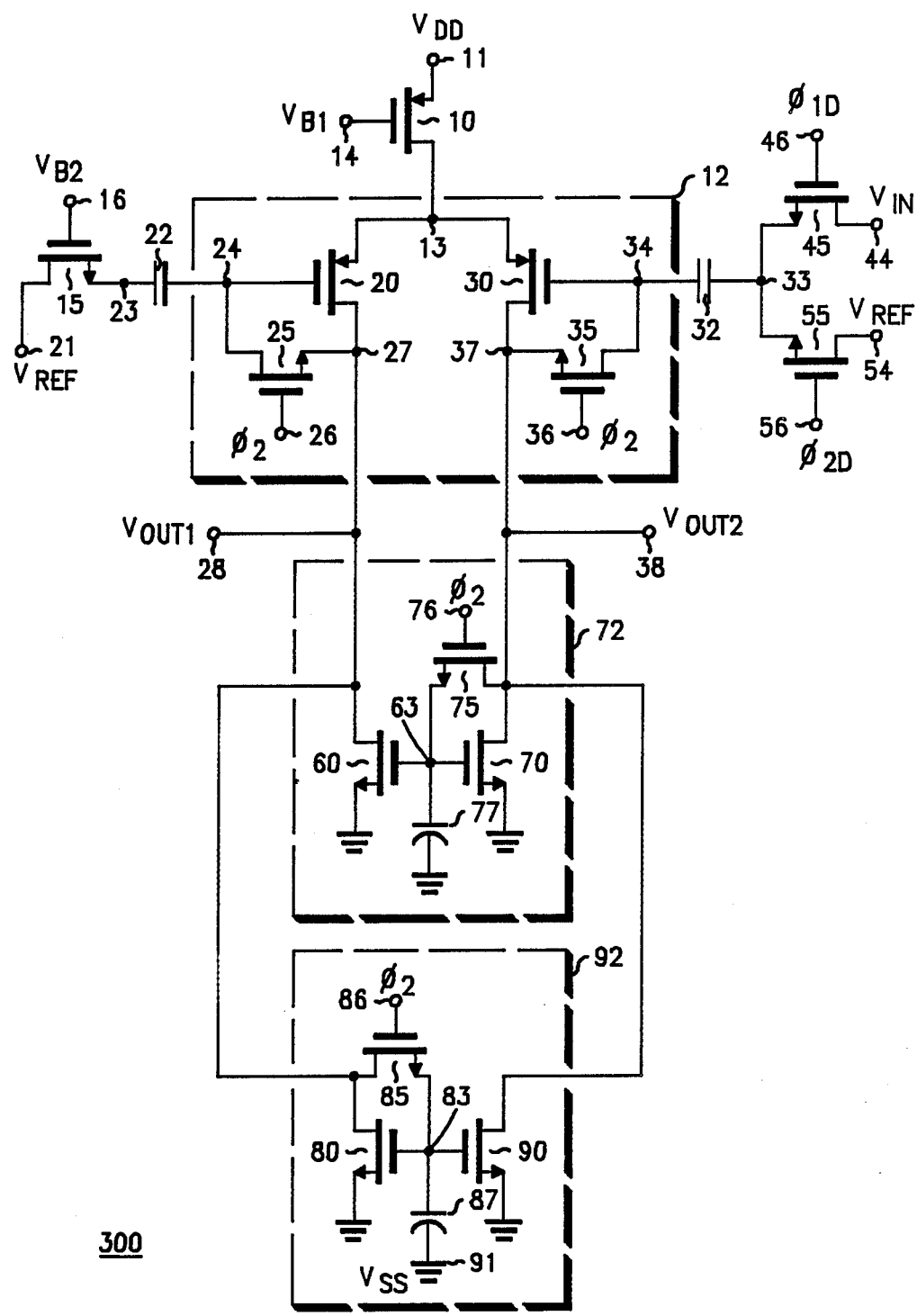
FIG. 3 is an electrical schematic diagram of the preferred embodiment of the present invention illustrating the parallel-load configuration.

Referring now to FIG. 3, differential input circuit 300 illustrates the preferred embodiment of the present invention. The schematic diagram of FIG. 3 illustrates distinctions from that of FIG. 1 in three areas: the constant current source; the input and initialization switches; and the parallel load stage configuration.

First, differential input circuit 300 illustrates that P-channel transistor 10 serves the function of constant current source 6 of FIG. 1. This constant current source transistor has its gate terminal connected to a fixed biased voltage VB1 at terminal 14. In the preferred embodiment, VB1 is approximately equal to 3.5 volts DC.

Second, FIG. 3 shows the N-channel MOSFET circuit configuration for each initialization and input switch. Initialization switches 2, 3, and 7, as well as the initialization switch of duplicate load stage 92, are all shown as N-channel MOSFET switches. As illustrated, the function of switch 2 in FIG. 1 is performed by transistor 25, which is connected across the gate-to-drain terminals of input transistor 20. Similarly, transistor 35, performing the function of input switch 3, is connected between the gate and drain terminals of input transistor 30. Transistors 75 and 85, connected to the gate and drain terminals of load transistor 70, and 80, respectively, perform the load stage initialization function. Clock 2 signal $\phi_2$ controls the gate terminals 26, 36, 76, 86 of all four initialization switches. Therafore, with a high clock signal voltage applied to the gate terminals of the N-channel switches, the switch transistors become conductive to effectively short their drain and source terminals together.

MOS transistor 15 performs the function of input switch 1 of FIG. 1. Since this device is only required for impedance matching, a fixed bias voltage $V_{B2}$ is applied to its gate at terminal 16. In the preferred embodiment, $V_{B2}$ is equal to the supply voltage $V_{DD}$. Hence, input switch 15 is always on.

The function of input switches 4 and 5 of FIG. 1 are performed in FIG. 3 by N-channel transistors 45 and 55, respectively. The gate terminal of transistor 45 is controlled by delayed clock 1 signal $\phi_{1D}$ at terminal 46, while the gate terminal of transistor 55 is controlled by $\phi_{D2}$ at terminal 56. As can be seen from the clock signal waveforms of FIG. 2, only one of these input switches, 45 or 55, will be on at one time.

In the embodiment of FIG. 3, all initialization and input switches are illustrated as single N-channel MOSFET devices. In an alternate embodiment, the input switches may be configured as a combination of P- and N-channel transistors connected in parallel to create a transmission gate as known in the art. The parallel P-channel MOSFET switch would then have its gate terminal controlled by a inverted form of the individual clock signal shown for the N-channel device. This transmission gate input switch configuration would then allow the differential comparator to be operated over the entire supply voltage range.

The third distinction from the circuit diagram of FIG. 1 lies in the configuration of the load device stages. If optimum power supply rejection performance is desired, the impedance looking into the two input nodes 23 and 33 of the differential input stage should be identical. However, this is not the case in the circuit of FIG. 1, since only load transistor 70 is switched during th initialization period. This presents a difference in impedances from output terminal 28 to ground than from terminal 38 to ground. Hence, output terminal 28 is affected differently by powe supply-induced noise than output terminal 38. In practice, this problem is alleviated somewhat by the very low impedance of the large P-channel input transistor devices 20 and 30, and the very large impedance of constant current source 6. Nevertheless, the difference in input resistances, combining with the circuit capacitances, means that there will be some frequencies for which the noise rejection during initialization will not be optimum.

This potential powe supply rejection problem is obviated in the preferred embodiment by providing parallel-load stages 72 and 92. The physical size of load devices 60 and 70 and bias capacitor 77 are reduced in half, and duplicate load devices 80 and 90 and bias capacitor 87 are provided. Initialization switch 85 is connected between the drain and gate terminals of load transistor 80, in the same manne that initialization switch 75 connects to load transistor 70. It is important to note that the opposite switching topology of initialization switches 75 and 85 provides opposite differential input impedances to load stages 72 and 92, respectively. Therefore, the parallel connection of these load stages at output terminals 28 and 38 presents equal impedances to output nodes 27 and 37 of differential input stage 12. The input impedances of either differential input circuit 100 or 300 are normally equal during the actual comparison cycle, since the initialization switches are open.

Even though it appears that adding duplicate load stage 92 would increase the circuit complexity, this is not the case for integrated circuitry. In reality, the same integration area is required since the actual device geometry of a single load stage has been reduced by factor of 2. Hence, improved power supply rejection performance and the same low offset parameters can be achieved with circuit 300 without increasing integration area. This improvement represents the third significant aspect of the present invention.

The preferred embodiment is designed to operate with a 5.0 volt DC supply voltage $V_{DD}$. The bias voltage $V_{B1}$ for current source transistor 10 is approximately 3.5 volts DC. With this bias voltage, supply node 13 reaches approximately 3.0 volts DC during initialization, and input nodes 24 and 34, as well as bias nodes 63 and 83, achieve a bias point of approximately 1.5 volts DC. In this way, the input and load devices are self-biased to their maximum gain region.

While differential input circuit 300 is shown in schematic circuit diagram form, it will be understood that the circuit can readily be integrated onto a monolithic substrate utilizing CMOS technology known to those skilled in the art.

In the preferred embodiment, the value of input capacitors 22 and 32 are each approximately 10 picofarad, while the values of bias capacitors 77 and 87 are each approximately 1.5 picofarad. Since these capacitance values are on the order of a few picofarads, the capacitors can be readily constructed as part of a single integrated circuit.

In summary, a differential CMOS comparator has been shown which exhibits low offset voltages and high gain. The present invention is particularly adapted for use in switched capacitor applications requiring precision comparison, such as analog-to-digital converters, zero crossing detectors, or threshold comparators. The differential input circuit configuration utilizes single minimum offset voltage, maximum gain, and optimum power supply rejection performance. The present invention achieves these goals with a minimal number of matched devices.

While specific embodiments of the present invention have been shown and described herein, further modifications and improvements may be made by those skilled in the art. All such modifications which retain the basic underlying principles disclosed and claimed herein are within the scope of this invention.

What is claimed is:

1. A voltage comparator comprising:
   a differential input stage including a pair of input devices connected in a differential amplifier configuration, said input stage having corresponding pairs of input terminals and output terminals;
   a load stage including a first pair of load devices connected to said pair of output terminals, each load device having a control terminal thereof connected to a first common bias node; and
   first means, including a first switched capacitor means connected to said first common bias node, for biasing said first pair of load devices to a bias point derived solely from at least one of said output terminals.

2. The voltage comparator according to claim 1, further comprising a pair of input capacitors, each capacitor connected in series from a respective control terminal of each of said pair of input devices to the respective input terminal.

3. The voltage comparator according to claim 2, further comprising a pair of input initialization switches, each switch connected from the respective input device control terminal to the respective output terminal.

4. The voltage comparator according to claim 3, further comprising input clocking means for providing control signals to said pair of input initialization switches such that said switches provide a current path to store offset voltages on said pair of input capacitors during an initialization period.

5. The voltage comparator according to claim 3, wherein each of said initialization switches are MOS transistors.

6. The voltage comparator according to claim 1, wherein said differential iput stage further includes current source means for providing constant current to said pair of input devices.

7. The voltage comparator according to claim 1, wherein said input devices are MOS transistors of the same channel type, and wherein said load devices are MOS transistors of the same channel type.

8. The voltage comparator according to claim 1, further comprising firsts and second supply voltage nodes.

9. The voltage comparator according to claim 8, wherein said first switched capacitor means includes a first load deice pair biasing capacitor connected from said first common bias node to said second supply voltge node.

10. The voltage comparator according to claim 9, wherein said first switched capacitor means further includes a first load device pair initialization switch connected from a first of said pair of output terminals to said first common bias node.

11. The voltage comparator according to claim 10, further comprising first load device pair clocking menas for providing control signals to said first load device pair initialization switch such that said switch provides a current path to store bias voltages on said first load device pair biasing capacitor during an initialization period.

12. The voltage comparator according to claim 1, wherein said load stage further includes;
a second pair of load devices connected to said pair of output terminals, each load device having a control terminal thereof connected to a second common bias node; and
second means, including a second switched capacitor means connected to said second common bias node, for biasing said second pair of load devices to a bias point derived solely from at least one of said output terminals.

13. The voltage comparator according to claim 12, further comprising first and second supply voltage nodes.

14. The voltage comaprator according to claim 13, wherein said second switched capacitor means includes a second load device pair biasing capacitor connected from said second common bias node to said second supply voltage node.

15. The voltage comparator according to claim 14, wherein said second switched capacitor means further includes a second load device pair initialization switch connected from a second of said pair of output terminals to said second common bias node.

16. The voltage comparator according to claim 15, further comprising second load device pair clocking means for providing control signals to said second load device pair initialization switch such that said switch provides a current path to store bias voltages on said second load device pair biasing capacitor during an initialization period.

17. A switched capacitor voltage comparator comprising:
first and second supply voltage nodes;
current source means connected from said first supply voltage node to a source node;
first and second input capacitors;
first and second input transistors connected to said source node in a differential amplifier stage configuration, each input transistor having a control terminal thereof connected to the respective input capacitor, said differential amplifier stage having corresponding first and second output terminals;
first and second initialization switches, each switch connected from the respective input transistor control terminal to the respective differential amplifier stag output terminal;
first and second load transistors, each load transistor connected from the respective differential amplifier stage output terminal to said second supply voltage node, each load transistor having a control terminal thereof connected to a first common bias node;
a first load biasing capacitor connected from said first common bias node to said second supply voltage node; and
a third initialization switch connected from said differential amplifier stage first output terminal to said first common bias node,
whereby said initialization switches provide current paths to store bias and offset voltages on said capacitors during an initialization period.

18. The voltage comparator according to claim 17, further comprising clocking means for providing control signals to said initialization switches.

19. The voltage comparator according to claim 17, wherein each of said input transistors, initialization switches, and load transistors are MOSFETs.

20. The voltage comparator according to claim 17, wherein said current source means is a MOSFET device connected to provide constant current to said source node.

21. The voltage comparator according to claim 17, further comprising:
third and fourth load transistors, each load transistor connected from said first and second differential amplifier stage output terminals, respectively, to said second supply voltage node, each load transistor having a control terminal thereof connected to a second common bias node;
a second load biasing capacitor connected from said second common bias node to said second supply voltage node; and
a fourth initialization switch connected from said differential amplifier stage second output terminal to said second common bias node.

22. The voltage comparator according to clarm 21, further comprising clocking means for providing control signals to said initialization switches.

23. The voltage comparator according to claim 21, wherein each of said input transistors, initialization switches, and load transistors are MOSFETs.

24. The voltage comparator according to claim 21, wherein said first and second input capacitors ar approximately 10 pf.

25. The voltage comparator according to claim 21, wherein said load biasing capacitors are approximately 1.5 pf.

26. The voltage comparator according to claim 17, further comprising first and second input switches, each switch connected from said first input capacitor to respective voltage comparator first and second input terminals.

27. The voltage comparator according to claim 26, further comprising a third input switch connected from said second input capacitor to a reference voltage terminal.

28. The voltage comparator according to claim 27, further comprising clocking means for providing control signals to said input switches.

29. The voltage comparator according to claim 27, wherein each of said input switches are MOSFETs.

* * * * *